United States Patent [19]
Wolf et al.

[11] Patent Number: 4,461,999
[45] Date of Patent: Jul. 24, 1984

[54] CIRCUIT FOR PRODUCING A PERIODIC SAWTOOTH SHAPED SIGNAL

[75] Inventors: Gerrit Wolf; Godefridus H. Haenen, both of Eindhoven, Netherlands

[73] Assignee: U.S. Philips Corporation, New York, N.Y.

[21] Appl. No.: 299,450

[22] Filed: Sep. 4, 1981

[30] Foreign Application Priority Data

Sep. 8, 1980 [NL] Netherlands ............... 8005054

[51] Int. Cl.³ .................. H03L 7/00; H03K 4/08; H04N 5/04
[52] U.S. Cl. ............................. 328/181; 328/155; 358/159; 375/111
[58] Field of Search ............ 328/133, 134, 155, 187, 328/181; 358/159

[56] References Cited

U.S. PATENT DOCUMENTS

| | | | |
|---|---|---|---|
| 3,127,570 | 3/1964 | Smeulers | 358/159 |
| 3,769,602 | 10/1973 | Griswold | 328/134 |
| 3,778,723 | 12/1973 | Schaefer | 328/155 |
| 4,215,315 | 7/1980 | Lambert et al. | 328/133 |

FOREIGN PATENT DOCUMENTS 2805691 8/1979 Fed. Rep. of Germany.

Primary Examiner—John S. Heyman
Attorney, Agent, or Firm—Thomas A. Briody; William J. Streeter

[57] ABSTRACT

A circuit for producing a periodic sawtooth signal comprising an oscillator which is directly synchronizable by synchronizing pulses and the natural frequency of which is approximately equal to the repetition frequency of the pulses in the synchronizing absence of synchronizing pulses. At a phase difference between the sawtooth signal and the synchronizing pulses which exceeds a predetermined value the supply of synchronizing pulses is inhibited and a frequency correction circuit is made operative, causing the natural frequency of the oscillator to change. When the said phase difference becomes smaller than the predetermined value the frequency correction is switched-off and the synchronizing pulses are applied to the circuit so that direct synchronization is effected.

11 Claims, 6 Drawing Figures

CIRCUIT FOR PRODUCING A PERIODIC SAWTOOTH SHAPED SIGNAL

BACKGROUND OF THE INVENTION

The invention relates to a circuit for producing a periodic sawtooth shaped signal having a trace and a retrace, comprising an oscillator which is directly synchronizable by synchronizing pulses having a substantially constant repetition frequency, a transmission switch for applying said synchronizing pulses to said oscillator, the natural frequency of said oscillator being approximately equal to the said repetition frequency in the absence of a synchronizing signal and being capable of being modified on the presence of a synchronizing signal to a value which is lower than the said repetition frequency, direct synchronisation taking place at the occurrence of a synchronizing pulse in the vicinity of a maximum value of the sawtooth signal.

Phase control loops in which the phase difference between the reference signal produced by an oscillator and the incoming synchronizing pulses is determined by a phase discriminator are of rather common usage in synchronizing circuits, for example for the line synchronization in television receivers. The output voltage of the phase discriminator is smoothed and the voltage obtained continuously adjusts the frequency and/or the phase of the oscillator in such manner that after some time, the so-called lock-in period, the phase difference becomes very small. Such a method is known as "indirect synchronisation". In this method the oscillator is always supplied with a control signal, whereas the synchronizing pulses never reach the oscillator directly.

At low frequencies, for example the field frequency in television receivers, so for which the repetition frequency of the synchronizing pulses is 50 or 60 Hz, a phase control is generally not used. One reason therefor is that such a control circuit is difficult to realize as, at a field frequency of 50 Hz, the control voltage must remain constant for at least 20 ms. It has further been found that the very long time constant of the smoothing filter, this long time constant being required for a proper noise insensitivity, is a source of all kinds of annoying slow phenomena. In practice, preference is therefore given to so-called "direct synchronisation circuits", in which the synchronizing pulses are directly applied to the oscillator to synchronize it.

Applicants' Netherlands Patent Application No. 7811597 (PHN 9287) discloses a sawtooth generator which is directly synchronizable and the natural frequency of which is in the absence of synchronizing pulses substantially equal to the nominal repetition frequency of these pulses. An advantage thereof is that the signal produced by the circuit, for example for the vertical deflection of a picture display tube in a television receiver, may be set nominally, that is to say to the frequency of the received synchronizing pulses, which results in a somewhat stable picture in the absence of these pulses.

The known circuit is symmetrically synchronisable, which means that synchronisation is possible when the natural frequency is somewhat higher or somewhat lower than the frequency of the synchronizing pulses. A slight deviation with respect to the nominal value may even already occur due to tolerances or temperature effects. So, when a synchronizing pulse occurs shortly before or after the final instant of the trace which would be obtained in the absence of synchronizing pulses the retrace is then immediately initiated. For this purpose the natural frequency of the oscillator is switchable to a value which is lower than the nominal frequency. If, however, the synchronizing pulse occurs a longer period of time before the said instant, the lock-in period of the oscillator is then rather long as the phase shift of the pulse with respect to the edge of the sawtooth varies very slowly because of the fact that the frequencies are almost equal, and as in view of the desired noise insensitivity the synchronising pulse does not influence the oscillator before the pulse occurs near the initial instant of the retrace of the free oscillation.

SUMMARY OF THE INVENTION

It is an object of the invention to provide a circuit for producing a sawtooth signal, the oscillator having in the free-running state a natural frequency which is substantially equal to the nominal repetition frequency of the synchronizing pulses and being symmetrically synchronizable by these pulses, while in all circumstances the lock-in period is considerably shorter than that of the prior art circuit. According to the invention, the circuit is characterized by a phase comparison stage for determining the phase difference between the sawtooth signal produced and the synchronizing signal and for blocking the transmission switch to prevent synchronizing pulses from being applied to the oscillator and rendering a frequency correction circuit operative for changing the natural frequency of the oscillator at a phase difference which exceeds a predetermined value, this phase comparison stage rendering the frequency correction inoperative and the transmission switch conductive to enable it to apply synchronizing pulses to the oscillator when the phase difference is less than said predetermined value.

The measure in accordance with the invention first changes the frequency in order to reduce the phase difference, whereafter the symmetrical synchronisation takes place in known manner. If a variation in the incoming synchronizing pulses occurs, a corresponding variation occurs immediately, that is to say without flywheel action, in the frequency correction. It should be noted that the German Patent Specification No. 973,223 describes an oscillator whose frequency is modulated by a modulating low-frequency source in the absence of coincidence between the oscillator signal and the synchronizing signal, more specifically with a swing which covers at least the whole hold range. This correction requires an additional source and has the disadvantage that in the absence of synchronizing pulses the frequency of the oscillator continues to vary, while the oscillator in accordance with the invention has in this event the nominal frequency.

Preferably, the circuit in accordance with the invention is characterized by a decrease in the natural frequency of the oscillator at the occurrence of a synchronizing pulse in a first portion of the trace period and by an increase in the said natural frequency at the occurrence of a synchronizing pulse in the remaining, second portion of the trace period.

To this end the circuit in accordance with the invention is characterized by a half-value threshold circuit for producing a signal having an edge at the instant in the trace period at which the sawtooth signal assumes the value which is approximately half the amplitude thereof, the first portion of the trace period being located before the said instant and the second portion after the said instant.

In a preferred embodiment the circuit embodying the invention is characterized in that the phase comparison stage comprises a first phase discriminator for determining the phase difference between the sawtooth signal produced and the synchronizing signal and for rendering the frequency correction circuit operative and a second phase discriminator for comparing the said phase difference with the predetermined value and for rendering the frequency correction inoperative and the transmission switch conductive.

The invention will now be further explained by way of non-limitative example with reference to the accompanying drawing.

DESCRIPTION OF THE PREFERRED EMBODIMENT

Figure 1:
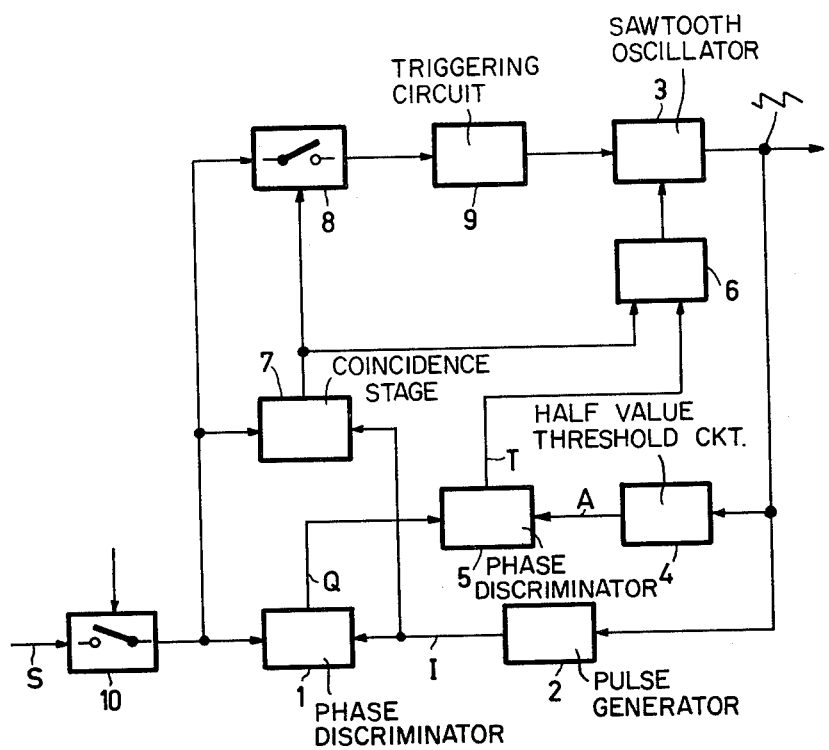
FIG. 1 is a block schematic circuit diagram of a construction of the circuit according to the invention.

In FIG. 1 reference numeral 1 denotes a phase discriminator which, via a switch 10, which will be described hereinafter, receives at an input terminal field synchronizing pulses S coming from a synchronisation separation stage, not shown. A train of pulses I which are produced by a pulse generator 2 is applied to a further terminal of discriminator 1. Reference numeral 3 denotes a sawtooth oscillator. Oscillator 3 produces a periodic sawtooth voltage which varies substantially linearly, at least in the trace period, and which is further processed in known manner in stages, not shown, for the deflection in the vertical direction, of one or more electron beams in a picture display tube. This sawtooth voltage is also applied to generator 2, in which the sawtooth is converted into a pulse shape, one of the edges of the pulse shape occurring at a predetermined instant of the period of the sawtooth, for example at the instant at which the retrace of the sawtooth is initiated.

The frequency of the sawtooth and consequently the frequency of pulses I differ little from the field frequency. At the output terminal of phase discriminator 1 there is a pulse Q, the leading edge of which coincides with the leading edge of pulse I, while the trailing edge thereof coincides with the leading edge of pulse S. For simplicity, the duration of the different edges is assumed to be infinitely short. So the duration of pulse Q is a measure of the phase difference between pulses S and I.

The sawtooth voltage produced by oscillator 3 is also applied to a half-value threshold circuit 4. This produces a signal A which has an edge at approximately the centre instant of the trace period, that is to say approximately at the instant in the trace period at which the sawtooth voltage assumes the value which is equal to half the amplitude thereof. This applies for the case in which oscillator 3 is in the free-running stage and no frequency correction signal is applied to it. Signal A and also pulse Q are applied to a second phase discriminator 5, the output signal T of which is applied to a frequency correction circuit 6.

Oscillator 3 is set in such manner that its natural frequency, that is to say in the free running state, in which no synchronizing pulses are applied to it, is equal to the nominal repetition frequency of the synchronizing pulses; in this example the field frequency in accordance with the television standard for which the television receiver of which the circuit of FIG. 1 forms part is suitable. However, it may happen, for example owing to tolerances or due to temperature effects that the two frequencies are somewhat unequal. In addition, at equal frequencies, the phase difference between the sawtooth and the synchronizing pulses is generally not equal to zero, for example when the receiver is switched on or when switching over from one transmitter to an other. If this phase difference is equal to zero, no signal is produced at the output terminal of phase discriminator 1 and no signal is produced by the phase discriminator 5 either and the natural frequency of the oscillator is not changed. In the absence of synchronizing pulses phase discriminators 1 and 5 do not produce a signal either and oscillator 3 oscillates freely at the nominal frequency.

When the said phase difference is not equal to zero, that is to say when the start of the retrace does not coincide with the synchronizing pulse, then a pulse T is applied to frequency correction circuit 6, while pulses S do not reach oscillator 3. Circuit 6 influences the natural frequency of oscillator 3. When pulse S occurs in the first portion, before the edge of signal A, of the trace of the sawtooth then the natural frequency of oscillator 3 is decreased. This implies that the period becomes longer, that is to say the next retrace occurs at a later instant than otherwise, so that the time interval between this retrace and the next synchronizing pulse is shorter. As a result thereof the phase difference measured by phase discriminator 1 during the next subsequent trace period becomes smaller. The synchronizing pulse is, as it were, advanced, while the displayed picture shifts upwards.

If now, pulse S occurs in the second portion, after the edge of signal A, of the trace period of the sawtooth, the natural frequency of oscillator 3 is increased by the action of circuit 6. This causes the period to become shorter, that is to say the next retrace occurs earlier than otherwise, so that the time interval between the synchronizing pulse and this retrace is shorter. As a result thereof the phase difference measured by phase discriminator 1 during the subsequent trace period becomes shorter. The synchronizing pulse is as it were shifted backward with respect to the sawtooth, while the displayed picture is shifted downwards.

From the preceding it appears that the phase difference between the sawtooth and the synchronizing pulses becomes smaller and smaller. Via the shortest path, the phase of the oscillator is shifted more rapidly to the phase of the pulses than for the case in which this shift was effected in one direction only. The frequency correction outlined above continues until the phase difference between the oscillator and the pulses decreases to below a predetermined value. For this purpose pulses S and pulses I are applied to a coincidence stage 7. When the said phase difference has become so small that a pulse S and a pulse I occur simultaneously, at least partly, then a signal which renders a controllable transmission switch 8 conductive is produced an an output terminal of stage 7. In these circumstances switch 8 allows pulses S to pass, as a result of which they are applied to a triggering circuit 9, which each time applies a trigger pulse to oscillator 3. The output signal of coincidence stage 7 is also applied to frequency correction circuit 6 or to the conductor from this correction circuit to oscillator 3, as a result of which the frequency correction is switched off. Before coincidence took place in stage 7 the natural frequency of oscillator 3 was close to the frequency of the synchronizing pulses and approached the target value, either from above or below. At the instant switch 8 passes a synchronizing signal, the frequency of oscillator 3 is switched to a value which is lower than the nominal frequency, for example in the manner described in Netherlands Patent Application No. 7811597. Direct synchronisation by the synchronizing pulses is effected, that is to say the retrace of the sawtooth is initiated at the instant at which a synchronizing pulse occurs. The frequency and the phase of the sawtooth produced are now substantially identical to the frequency and the phase of these pulses.

It will be obvious that the lock-in period of the oscillator will be still shorter than if a coincidence stage were used, if a higher value is chosen for the phase difference for which the frequency correction is switched off while direct synchronisation takes place. To this end, coincidence stage 7 is replaced by a phase discriminator which supplies a signal when the phase difference measured therein decreases to below a predetermined value. Stage 7 may also be dispensed with when its task is performed by phase discriminator 1.

Figure 2:
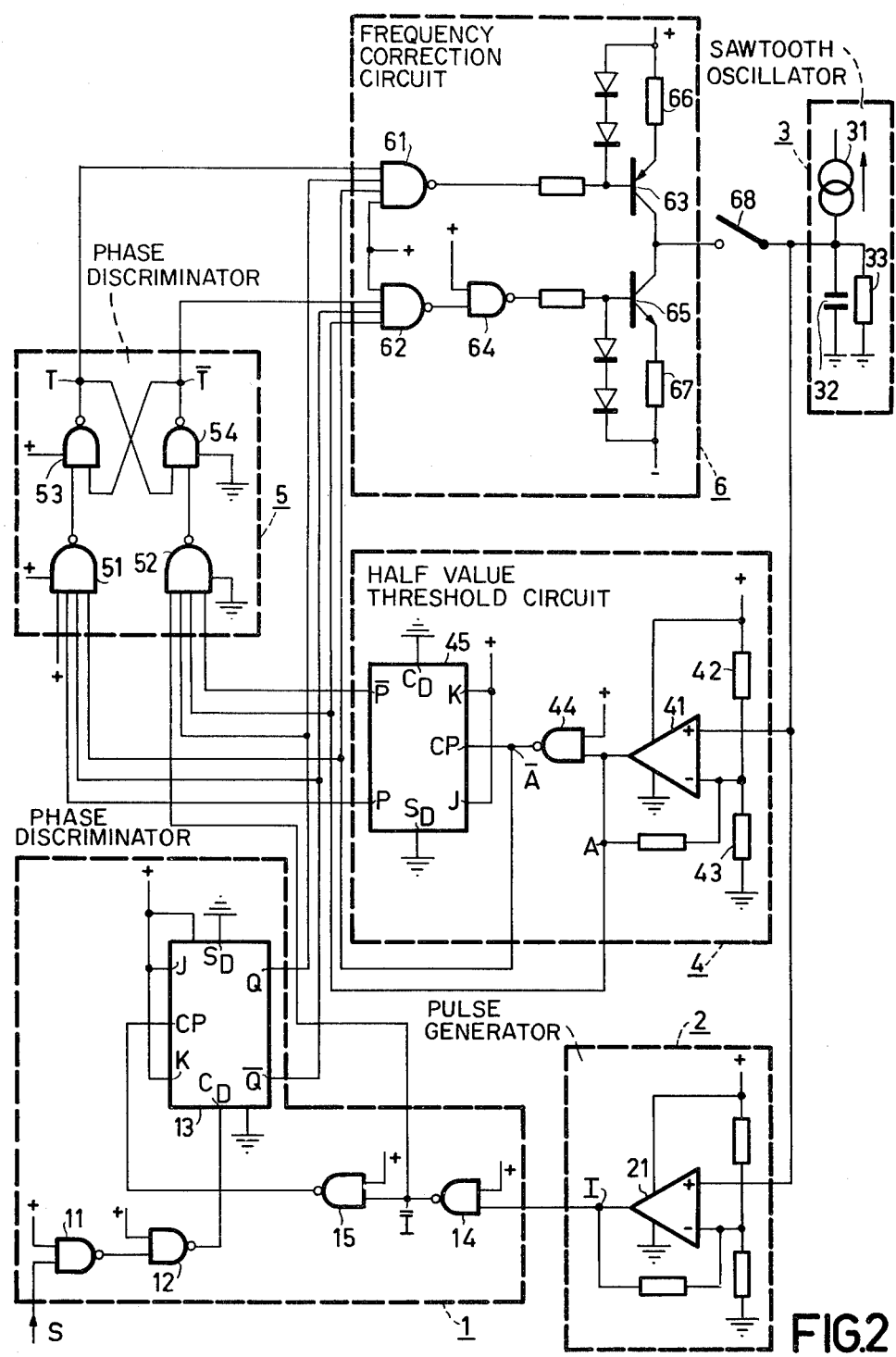
FIG. 2 shows a detailed construction of a phase comparison stage and of a frequency correction circuit which may form part of the circuit of FIG. 1, FIGS. 3 and 4 show waveforms which would occur in the circuit of FIG. 2 when frequency correction were absent

The detailed circuit of FIG. 2 has been implemented for a large part by means of logic circuits and operational amplifiers and is consequently suitable for integration. FIGS. 3a and 4a show the variation versus time of the sawtooth produced by oscillator 3. The retrace period is then assumed to be infinitely short. Pulse generator 2 comprises a differential amplifier 21 to whose non-inverting input terminal the sawtooth is applied, while the inverting input terminal is connected to a d.c. voltage. The output signal of amplifier 21 is the pulse I. The leading edge thereof coincides with the retrace of the sawtooth and the trailing edge is produced at an instant which is independent of the said d.c. voltage. Instead of being derived from the sawtooth produced by oscillator 3 pulse I can be derived, if so desired, from one of the stages which are not shown in the drawing, for example from the field output amplifier to which a field deflection coil is connected, which are coupled to oscillator 3.

Also half-value threshold circuit 4 comprises a differential amplifier 41, to whose non-inverting input terminal the sawtooth of oscillator 3 is applied, while the inverting input terminal is connected to a d.c. voltage. By means of a resistive voltage divider 42, 43 this d.c. voltage is adjusted to a value which is approximately equal to half the amplitude of the sawtooth in the non-synchronized and non-corrected state of oscillator 3. If this state is obtained, the output signal A of amplifier 41 is a symmetrical square-wave voltage, as shown in FIGS. 3b and 4b, having an edge at the centre instant of the trace. If this situation is not obtained, then this edge occurs before or after this instant. Signal A is applied to an inverting stage 44 which is in the form of a NAND-gate and whose output signal $\overline{A}$ is applied to a JK-flip-flop 45, which produces a square-wave signal P of half the field frequency (see FIGS. 3e and 4e).

FIG. 3c shows the synchronizing pulses S for the case in which the occurrence thereof takes place in the first portion of the trace period while FIG. 4c applies to the case in which they occur in the second portion of the trace period. Phase discriminator 1 comprises two inverter stages 11 and 12 in the form of NAND-gates for applying pulses S to the resetting input terminal $C_D$ of a JK-flip-flop 13 and two inverter stages 14 and 15, also in the form of NAND-gates, for applying pulses I to the clock input terminal CP of flip-flop 13. The J and K input terminals of flip-flop 13 are connected to the positive supply voltage while the setting input terminal $S_D$ thereof is connected to ground. In these circumstances, the output signal Q of flip-flop 13 has a descending edge each time the leading edge of pulse S occurs, while an ascending edge coincides with the retrace. FIG. 3d shows the signal Q for the case in which pulse S occurs in the first portion of the trace period while FIG. 4d shows signal Q for the case the pulse occurs in the second portion of the trace period.

Phase discriminator 5 comprises a NAND-gate 51 to which the signal $\overline{Q}$ from flip-flop 13, the output signal $\overline{A}$ from gate 44 and the signal P of FIGS. 3e and 4e are applied while a fourth input terminal is connected to the supply voltage. Phase discriminator 5 comprises a further NAND-gate 52 to which the signal Q, signal A, the other output signals $\overline{P}$ of flip-flop 45 and the output signal $\overline{I}$ of gate 14 are applied. The output terminals of gates 51 and 52 are connected to two NAND-gates 53 and 54, which form a flip-flop. It can be seen that the output signal T of gate 53 has an ascending edge for the case in which pulse S occurs in the first portion of the trace period (see FIG. 3f), this ascending edge coinciding with the descending edge of signal Q. In the other case signal T has a descending edge (see FIG. 4f) in the centre of a trace period.

Frequency correction circuit 6 comprises a NAND-gate 61 to which the signals T and Q and also the signal $\overline{A}$ is applied, and a further NAND-gate 62 to which the output signal $\overline{T}$ of gate 54 and signal $\overline{Q}$ and also signal A are applied. In addition, a fourth input terminal of gates 61 and 62, respectively, is connected to the supply voltages. The output terminal of gate 61 is connected to the base of a pnp transistor 63 and the output terminal of gate 62 is connected via an inverter stage 64 in the form of a NAND-gate to the base of a npn transistor 65. The emitter of transistor 63 is connected to the positive supply voltage via a resistor 66, while the emitter of transistor 65 is connected to a negative voltage via a resistor 67. The collectors of the two transistors are interconnected. Oscillator 3 is formed in known manner by a constant current source 31, shown schematically, which during the trace period discharges a capacitor 32 which is shunted by a resistor 33. The junction of elements 31, 32 and 33 is connected to the non-inverting input terminals of amplifiers 21 and 41, respectively, and, via a switch 68 to the collectors of transistors 63 and 65, respectively.

When the synchronizing pulse occurs in the first portion of the trace period the output signal of gate 64 is a logic 0. The output signal of the gate 61 is a logic 1, but it is a logic 0 during the trace periods occurring after the occurrence of the first pulse S, namely in the interval located in the first portion of the trace period before the occurrence of pulse S (FIG. 3g). In these circumstances transistor 65 remains in the non-conductive state, while transistor 63 is only conductive during the said intervals, causing a constant current to be applied to capacitor 32 via the conducting switch 68. Consequently, the discharge of this capacitor occurs slower.

Figure 3:
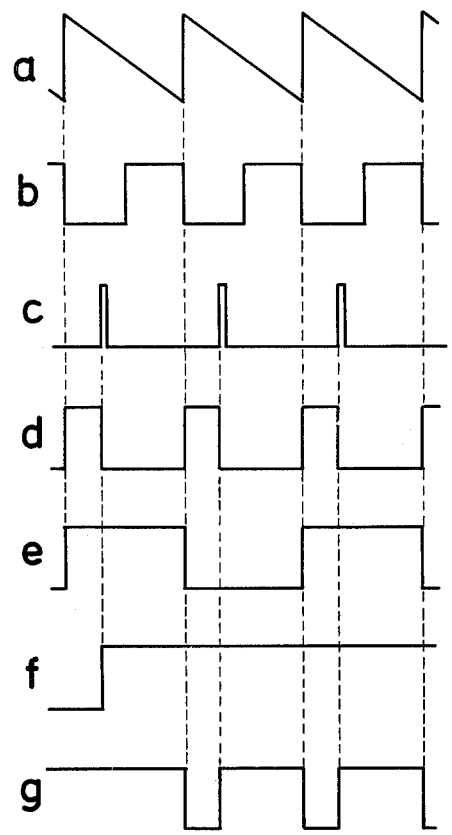
Figure 4:
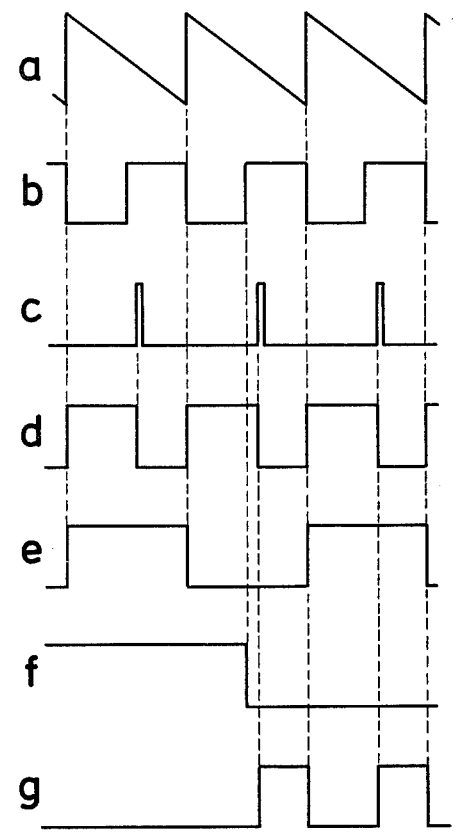
Figure 5:
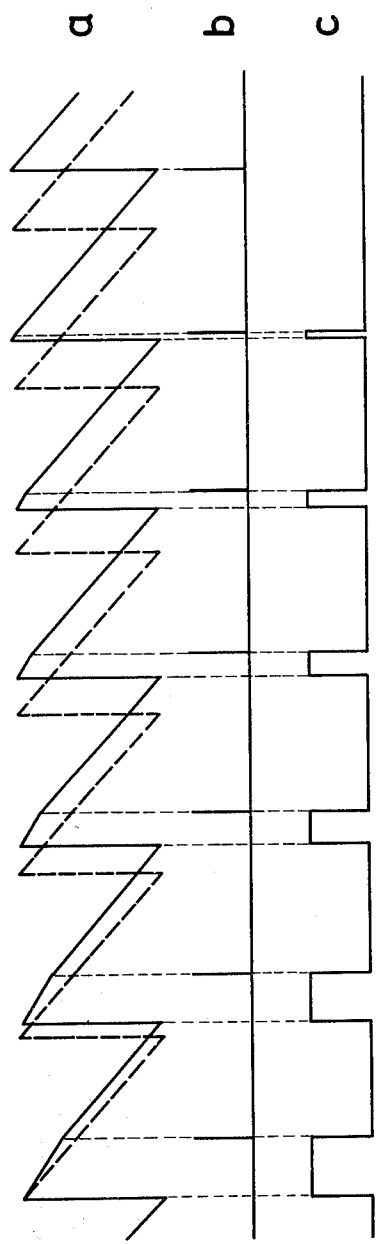
FIGS. 5 and 6 show waveforms occurring in the circuit of FIG. 2 in the presence of frequency correction.

FIGS. 3 and 4 show the waveforms in the absence of correction. In FIG. 5a the broken line represents the unchanged sawtooth of oscillator 3, while the solid line represents the sawtooth in the case of frequency correction by means of the circuit shown in FIG. 2. FIG. 5b shows the synchronizing pulses, which are assumed to be infinitely short and FIG. 5c represents the current surges from transistor 63. FIG. 5a shows that the slope of the descending edge of the sawtooth is smaller before the occurrence of a synchronizing pulse than after the occurrence thereof, as a result of the current produced by transistor 63. After the synchronizing pulse the slope is equal to the slope of the broken-line sawtooth. From FIG. 5a it appears that, due to the correction the trace period is of a longer duration, that is to say the frequency is decreased. As the phase difference between the retrace period, which is assumed to be infinitely short in the Figure, and the synchronizing pulse becomes smaller and smaller the period of time during which the transistor 63 is conductive (see FIG. 5c) is even shorter. After having attained a minimum, the frequency increases again and approaches the target value from below.

After a number of periods the phase difference becomes very small while the frequency has become almost equal to the repetition frequency of the synchronizing pulses. The coincidence stage 7, not shown in FIG. 2, is formed in known manner, for example by means of an AND-gate. At the instant coincidence is detected in this stage between pulses A and pulses I the switch 68, which is only shown schematically in FIG. 2, is inhibited by the action of stage 7. Simultaneously, stages 8 and 9 are put into operation and oscillator 3 is synchronized symmetrically. This portion of the circuit of FIG. 1 may be of a prior art construction and has therefore not been shown in FIG. 2.

In the case in which the synchronizing pulse occurs in the second portion of the trace period the output signal of gate 61 is a logic 1 from the second trace period, occurring after the occurrence of the first pulse S onwards. The output signal of gate 64 is then a logic 0, except in the second portion of the trace period after the occurrence of pulse S where it is a logic 1 (FIG. 4g). In these circumstances transistor 63 remains in the non-conductive state, while transistor 65 is only conductive during the said intervals, causing a constant current to be withdrawn from capacitor 32. Consequently, this capacitor is discharged more rapidly.

Figure 6:
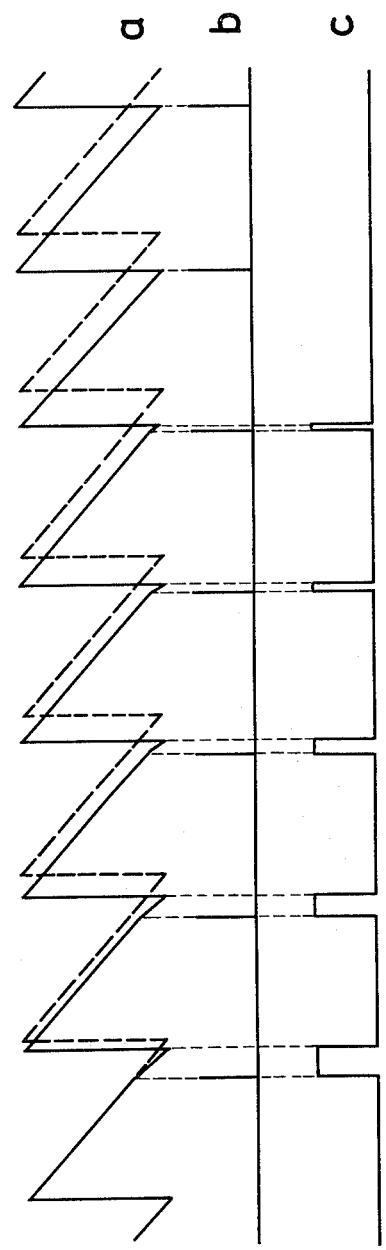

In a corresponding manner as in FIGS. 5a, b and c, FIG. 6a shows the sawtooth for the case the synchronizing pulse occurs in the second portion of the trace period, while FIG. 6b represents the synchronizing pulses and FIG. 6c represents the current surges from transistor 65. As a result of the current applied to the transistor 65 the slope of the descending edge of the sawtooth of FIG. 6a is steeper after the occurrence of a synchronizing pulse than before the occurrence thereof, where the slope is equal to that of the non-corrected sawtooth. Due to the action of the correction the trace period becomes shorter, that is to say the frequency is increased. From FIG. 6c it appears that the period of time transistor 65 conducts is ever shorter. After having attained a maximum, the frequency decreases again and approaches the target value from above, whereafter symmetrical synchronisation is effected in the manner described above.

From FIGS. 3 and 4 it appears that the frequency correction does not start immediately. In order to prevent disturbing effects from occurring in the invertal it may be advantageous to include a delay element in the conductor between discriminator 5 and circuit 6, which achieves that the output signal of discriminator 5 is not applied to circuit 6 until at least one and a half period after signal Q has become non-zero. This time corresponds to the time until the occurrence of the edge in FIG. 4b, which immediately preceeds the edge of FIG. 4f.

When no synchronizing pulse S is applied to the circuit of FIG. 2, the signal Q of flip-flop 13 becomes a logic 1 while the signal $\overline{Q}$ becomes a logic 0. As a result thereof transistors 63 and 65 remain in the non-conductive state and oscillator 3 is not corrected.

Correction by means of the circuit of FIG. 2 takes place in that one of the above-mentioned transistors is conductive during part of the time. It will be obvious that the circuit can be implemented in such a way that the relevant transistor conducts each time during a longer time interval or even during the entire trace period, as a result of which lock-in occurs somewhat faster. In the latter case the bend shown in FIGS. 5a and 6a does not occur and during the whole lock-in period oscillator 3 has a constant frequency with a frequency jump from and to, respectively, the nominal frequency at the beginning and at the end of the said period of time. Because of the above-mentioned bend it may be desirable to use the output signal of oscillator 3 to synchronize a second sawtooth generator. The above-mentioned bend does not occur when the frequency correction is effected in a different, known manner other than by triggering a current source. In practice, all the variants described have advantages and disadvantages.

A disadvantage of the above-described circuit might be the fact that synchronizing pulses which occur at any arbitrary instant during the trace period might influence the natural frequency of the oscillator. This increases the sensitivity to noise. This disadvantage does not occur when a muting circuit is used. Such a circuit achieves that when no, or a very weak transmitter signal is received by the television receiver a suppression signal is generated which blocks the sound channel. This suppression signal can also block the synchronizing pulse-separation stage which preceeds phase discriminator 1 in FIG. 1. Alternatively, it may be applied to a transmission switch 10 to block the conductor through which the synchronizing pulses are applied to the components 1, 7 and 8 of FIG. 1. In that case no disturbances can penetrate into the circuit and oscillator 3 oscillates at the nominal frequency.

When a television signal of a proper quality is received, the muting signal is not generated. The sound channel becomes operative while switch 10 is rendered conductive. A still better noise insensitivity is obtained when, at least during lock-in pulses S are not obtained from a transmitter but from a divider circuit which derives the field frequency from the line frequency in known manner.

The circuits of FIG. 1 and FIG. 2, respectively, can be simplified in that circuit 4 and discriminator 5 are omitted, so that no measurement of the phase with respect to the instant which corresponds to half the amplitude is effected. In that case only one of the FIGS. 5 and 6 applies, that is to say that during lock-in the natural frequency always approaches the nominal value from the same direction and that either from above or from below. This simplification is of course obtained at the expense of a prolongation of the lock-in period, at least in certain circumstances.

What is claimed is:

1. A circuit for producing a periodic sawtooth shaped signal having a trace and a retrace comprising;
    a source of a synchronizing pulses having a substantially constant repetition frequency,
    an oscillator which is directly synchronizable by said synchronzing pulses, the natural frequency of said oscillator in the absence of synchronizing pulses being approximately equal to said repetition frequency,
    a transmission switch for applying said synchronizing pulses to said oscillator,
    a frequency correction circuit connected to said oscillator,
    a phase comparison stage coupled to the output of said oscillator and to said source of synchronizing pulses for determining the phase difference between the sawtooth signal produced by said oscillator and the synchronizing pulses and for blocking the transmission switch to prevent synchronizing pulses from being applied to said oscillator and for rendering said frequency correcting circuit operative to change the frequency of said oscillator at a phase difference which exceeds a predetermined value,
    said phase comparison stage rendering the frequency correction circuit inoperative and the transmission switch conductive to enable it to apply synchronizing pulses to the oscillator when the phase difference is less than said predetermined value.

2. A circuit as claimed in claim 1 wherein said frequency correcting circuit is rendered operative to decrease the frequency of the oscillator upon the occurrence of a synchronizing pulse during a first portion of a trace period and to increase the frequency of the oscillator upon the occurrence of a synchronizing pulse during the remaining, second portion of a trace.

3. A circuit as claimed in claim 2 further comprising a half-value threshold circuit coupled to said frequency control circuit for producing a signal having an edge at the instant of the trace period at which the sawtooth signal assumes the value which is approximately half the amplitude thereof, the first portion of a trace period being before the said instant and the second portion after said instant.

4. A circuit as claimed in claim 1 wherein the phase comparison stage comprises a first phase discriminator for determining the phase difference between the sawtooth signal produced and the synchronizing signal and for rendering the frequency correction circuit operative and a second phase discriminator for comparing the said phase difference with the predetermined value and for rendering the the frequency correction circuit inoperative and the transmission switch conductive.

5. A circuit as claimed in claim 4 further comprising a third phase discriminator connected to the half-value threshold circuit for determining the phase difference between the synchronizing pulses and the edge of the signal produced by the half-value threshold circuit and for rendering the frequency correction circuit operative.

6. A circuit as claimed in claim 5 wherein an input signal of the third phase discriminator is the output signal of the first phase discriminator while the other input signal of the third phase discriminator is the signal produced by the half-value threshold circuit.

7. A circuit as claimed in claim 4 wherein the second phase discriminator is a coincidence stage.

8. A circuit as claimed in claim 1 wherein the natural frequency of the oscillator is constant for the time the frequency correction circuit is active.

9. A circuit as claimed in claim 1 wherein the frequency correction circuit comprises a signal source for changing the natural frequency of the oscillator, said signal source being active for a portion of the period.

10. A circuit as claimed in claim 1 further comprising a delay element included between the phase comparison stage and the frequency correction circuit.

11. A circuit as claimed in claim 1 further comprising a switch for interrupting the supply line of the synchronizing pulses to the phase comparison stage and to the transmission switch in the event of insufficient reception of the synchronizing pulses.

* * * * *